(12) United States Patent
Peterson

(10) Patent No.: US 8,633,745 B1
(45) Date of Patent: Jan. 21, 2014

(54) CIRCUITS AND RELATED TECHNIQUES FOR DRIVING A HIGH SIDE OF A HALF BRIDGE CIRCUIT

(75) Inventor: Douglas Peterson, Bloomington, MN (US)

(73) Assignee: Allegro Microsystems, LLC, Worcester, MA (US)

( * ) Notice: Subject to any disclaimer, the term of this patent is extended or adjusted under 35 U.S.C. 154(b) by 0 days.

(21) Appl. No.: 13/599,211

(22) Filed: Aug. 30, 2012

(51) Int. Cl.
*H03L 7/06* (2006.01)

(52) U.S. Cl.
USPC .......................................... 327/156; 327/147

(58) Field of Classification Search
USPC .................................. 327/108–111
See application file for complete search history.

(56) References Cited

U.S. PATENT DOCUMENTS

| | | | |
|---|---|---|---|
| 5,917,359 A * | 6/1999 | Fukunaga et al. ............ | 327/381 |
| 6,611,154 B2 | 8/2003 | Grasso et al. | |
| 6,809,553 B2 | 10/2004 | Morini et al. | |
| 7,212,033 B2 * | 5/2007 | Subramanian et al. ......... | 326/68 |
| 8,044,699 B1 * | 10/2011 | Kelly ............................ | 327/333 |
| 2006/0087363 A1 * | 4/2006 | Galbiati ........................ | 327/494 |
| 2007/0182386 A1 | 8/2007 | Garner | |
| 2008/0042595 A1 * | 2/2008 | Ribarich ....................... | 315/291 |
| 2008/0246518 A1 * | 10/2008 | Galvano ........................ | 327/110 |
| 2008/0284357 A1 * | 11/2008 | Ribarich ....................... | 315/309 |
| 2009/0256617 A1 * | 10/2009 | Ochi ............................. | 327/333 |
| 2010/0026361 A1 | 2/2010 | Jung et al. | |
| 2012/0013323 A1 * | 1/2012 | Kenney ........................ | 323/285 |
| 2013/0009674 A1 * | 1/2013 | Reese et al. .................. | 327/109 |

FOREIGN PATENT DOCUMENTS

| | | |
|---|---|---|
| GB | 2 244 400 A | 11/1991 |
| JP | 2003-179482 | 6/2003 |
| WO | WO 03/055072 | 7/2003 |

OTHER PUBLICATIONS

Allegro Microsystems, Inc. Data Sheet; "A4933 Automotive 3-Phase MOSFET Driver;" Dec. 1, 2010; 25 pages.
Allegro Microsystems, LLC; annotated schematic diagram representative of Allegro Part No. A-4933; Dec. 1, 2010; 1 page.
PCT International Search Report and Written Opinion of the ISA dated Dec. 3, 2013; for PCT Pat. App. No. PCT/US2013/054603; 15 pages.

\* cited by examiner

*Primary Examiner* — Adam Houston
(74) *Attorney, Agent, or Firm* — Daly, Crowley, Mofford & Durkee, LLP

(57) ABSTRACT

A level shift circuit is configured to control a high side transistor of a half bridge circuit. The level shift circuit has composite current mirrors and other circuits that reduce the effect of transient voltages that are produced as the half bridge circuit is switched.

20 Claims, 12 Drawing Sheets

CIRCUITS AND RELATED TECHNIQUES FOR DRIVING A HIGH SIDE OF A HALF BRIDGE CIRCUIT

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to electronic circuits and, more particularly, to a level shift circuit for driving a high side of a half bridge circuit.

BACKGROUND OF THE INVENTION

High voltage half bridge circuits can be configured to drive switched voltages to a load (e.g., to an electric motor) that take on voltage values including a high voltage (e.g., six hundred volts) and a low voltage (e.g., a ground voltage). The high voltage half bridge circuits described herein operate nonlinearly providing only the high voltage to the load at some times and the low voltage to the load at other times. In some applications, by changing a duty cycle of the high voltage applied to the load, the power to the load can be changed, resulting, for example, in changes to a speed of rotation of an electric motor load.

Half bridge circuits comprise a series coupling of two transistors. A node coupling the two transistors is coupled to the load. In order to control the half bridge, a control circuit is coupled to control nodes (e.g., gates) of the two transistors.

High voltage, solid state, half bridge circuits are most often constructed with two NMOS field effect transistors (FETS) or two NPN insulated gate bipolar transistors (IGBTs) coupled in series to form the half bridge. The high side NPN power transistor, i.e., the NPN power transistor coupled to the high voltage, requires a control voltage at its base that can take on voltage values from the negative supply voltage (usually ground) when the high side transistor is off to a voltage higher than the high supply voltage (e.g., higher than about six hundred volts) when the high side transistor is on. In order to achieve this wide range of control voltages, the control circuit requires a high voltage level translator (or level shifter).

One exemplary level shifter is described in U.S. Pat. No. 5,917,359, issued Jun. 29, 1999. Some elements of the level shifter described in U.S. Pat. No. 5,917,359 have become common.

Referring now to FIG. 1, a half bridge 19 is comprised of two NPN power IGBTs (insulated gate bipolar transistors) 17, 18, coupled together at a node HS. The node HS is coupled to a load 21, e.g., to an electric motor. The transistor 17 is a high side transistor coupled to a high voltage power supply, $V_{DD}$. The power supply. $V_{DD}$, can have a voltage of hundreds of volts, for example, six hundred volts. The transistor 18 is a low side transistor coupled to a lower voltage, e.g., to a ground voltage.

A control circuit includes a conventional high voltage control circuit 10 (a level shift circuit) coupled to control the high side transistor 17 and a low voltage control circuit 30 coupled to control the low side transistor 18. The high voltage control circuit 10 and the low voltage control circuit 30 can be integrated onto a common substrate. In some embodiments, the half bridge, circuit 19 is separate from the common substrate.

The high voltage control circuit 10 can include a pulse generating circuit 1 coupled to receive an input signal and configured to generate on and off signals (pulse signals), preferably having opposite states. The high voltage control circuit 10 can also include two high voltage FETs 2, 3 coupled to receive the on and off pulse signals at control inputs (e.g., gates), two resistors 4, 5 coupled to drains of the two FETs 2, 3, two CMOS inverters 6, 7 also coupled to the drains of the FETs 2, 3, a protection circuit 27 coupled to the two inverters 6, 7, a latch 15 coupled to the protection circuit 27, a buffer circuit 11, 12, 13, and a capacitor 16 coupled at one end to the node, HS, and coupled at the other end to provide a voltage VB (a bootstrap supply) as a power supply to portions of the high voltage control circuit 10.

The capacitor 16, which is referred to herein as a "bootstrap capacitor," can be supplemented in parallel with a larger off-chip capacitor. CMOS logic 6, 7, 27, 15, 11 operates across the bootstrap supply provided by the capacitor 16, i.e., across the voltage VB and a voltage at the node HS. The voltage difference between the voltage VB and the voltage at the node HS can be maintained at a low voltage, for example, fifteen volts, though both the voltage VB and the voltage at the node HS can move together through a wide range of voltages.

The high voltage control circuit 10 can also include a diode D10 and a resistor R10 coupled in series to receive a power supply voltage Vcc, which can, for example, be about fifteen volts.

A capacitor 20 can be coupled between the high voltage power supply $V_{DD}$ and ground.

Assume that the high voltage supply $V_{DD}$ is set to six hundred volts and the power supply voltage $V_{CC}$, is set to fifteen volts. When the transistor 18 is on, the node HS has a voltage near ground, and the bootstrap capacitor 16 charges to within one diode voltage of the power supply voltage $V_{CC}$, or approximately 14.3 volts. As the half bridge circuit 19 is toggled, voltage at the node HS toggles between zero volts and six hundred volts, and the voltage at the far end of the capacitor 16 moves accordingly. Thus, the difference between the voltage VB and voltage at the node HS (the bootstrap supply voltage) remains nearly constant at 14.3 V. Therefore, the CMOS circuitry 6, 7, 27, 15, 11 need only tolerate a fifteen volt supply, but the CMOS circuitry 6, 7, 27, 15, 11 must be sufficiently isolated from ground to tolerate six hundred fifteen volts, and FETs 2 and 3 must tolerate six hundred fifteen volts.

In operation, parasitic capacitances of the high voltage FETS 2 and 3 present a problem common to all such high voltage control circuits (i.e., level translator circuits or level shift circuits). In essence, the parasitic capacitances must be charged and discharged during high voltage switching. When the high side transistor 17 is abruptly turned on (and the low side transistor 18 is abruptly turned off), the drain capacitance of the FETS 2 and 3 is charged to a high voltage through the resistors 4, 5, creating transient voltage drops across both of the resistors 4, 5 at the same time (i.e., a common-mode voltage transient). Such transients could be detected by the CMOS logic controlling the high side transistor 17, leading to erroneous control of the half bridge 19 and potential destruction of one of the transistors 17, 18 due to high current spikes though both of the transistors 17, 18 at the same time. This problem can be partially solved by the protection circuit 27, which prevents changes to the state of the set-reset latch 15 whenever both inverters 6 and 7 present transients at the same time (due to the above-described common mode transient).

While the protection circuit 27 can provide some protect from common mode transient voltages, the protection circuit also tends to slow down the high voltage control circuit 10, resulting in a limit on the rate at which the half-bridge 19 can be switched.

Therefore, it would be desirable to provide a high side control circuit and associated technique that can provide proper control of a half bridge, reducing or eliminating the effect of common mode voltage transients, but without limiting a speed at which the half bridge can be switched.

SUMMARY OF THE INVENTION

The present invention provides a high side control circuit and associated technique that can provide proper control of a half bridge, reducing or eliminating the effect of common mode voltage transients, but without limiting a speed at which the half bridge can be switched.

In accordance with one aspect of the present invention, an electronic circuit is for driving an N-type transistor, the N-type transistor having a control node, an output node, and a power supply node coupled to a high voltage supply. The electronic circuit includes a bootstrap voltage node capacitively coupled to the output node of the N-type transistor. The electronic circuit also includes a first input transistor having a control node, a current input node, and a current output node, wherein the control node is coupled to receive a first input signal. The electronic circuit also includes a second input transistor having a control node, a current input node, and a current output node, wherein the control node is coupled to receive a second input signal. The electronic circuit also includes a first composite current mirror circuit having a control node, a current input node, and a current output node. The control node of the first composite current mirror circuit is coupled to the current input node of the first input transistor, and the current input node of the first composite current mirror circuit is coupled to the bootstrap voltage node. The electronic circuit also includes a second composite current mirror circuit having a control node, a current input node, and a current output node. The control node of the second composite current mirror circuit is coupled to the current input node of the second input transistor, and the current input node of the second composite current mirror circuit is coupled to the bootstrap voltage node. The electronic circuit also includes a first comparator having a first input node coupled to the current output node of the second composite current mirror circuit and having a second input node coupled to receive a first reference voltage. The first reference voltage is related to a voltage at the output node of the N-type transistor. The first comparator also has an output node. The electronic circuit also includes a second comparator having a first input node coupled to the output node of the first composite current mirror circuit and having a second input node coupled to receive a second reference voltage. The second reference voltage is related to the voltage at the output node of the N-type transistor. The second comparator also has an output node.

BRIEF DESCRIPTION OF THE DRAWINGS

The foregoing features of the invention, as well as the invention itself may be more fully understood from the following detailed description of the drawings, in which.

DETAILED DESCRIPTION OF THE INVENTION

Before describing the present invention, some introductory concepts and terminology are explained. As used herein, the term "composite current mirror" is used to describe a series coupling of two or more current mirror circuits, or simply current mirrors.

Figure 1:
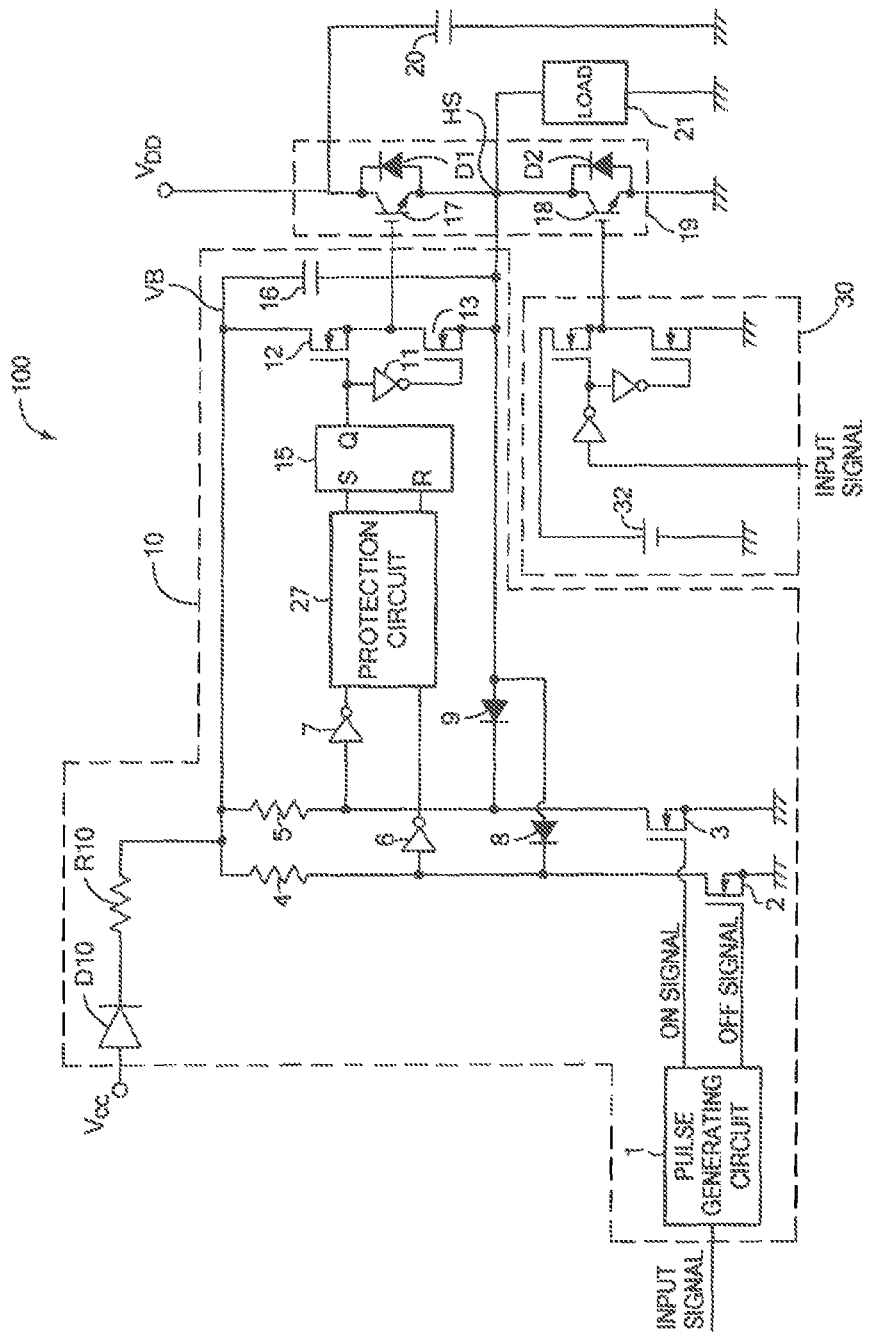
FIG. 1 is a pictorial showing a prior art half bridge circuit comprised of a high side NPN transistor and a low side NPN transistor, both driven by a prior art control circuit, the prior art control circuit having a level shift circuit to drive the high side NPN transistor.
Figure 2:
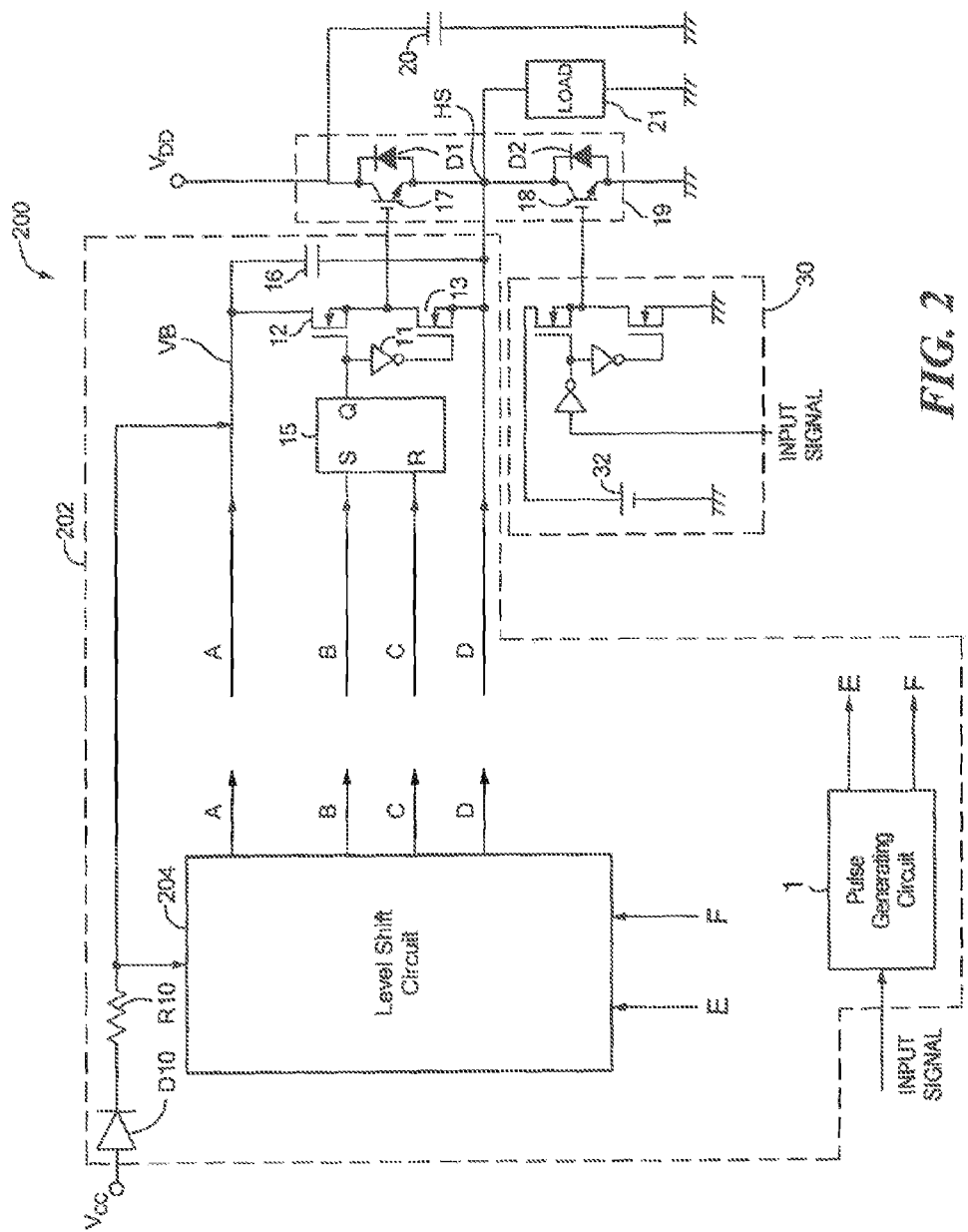
FIG. 2 is a block diagram showing a half bridge circuit comprised of a high side NPN transistor and a low side NPN transistor, both driven by a control circuit, the control circuit having a level shift circuit to drive the high side NPN transistor.

Referring to FIG. 2, in which like elements of FIG. 1 are shown having like reference designations, an exemplary electronic circuit 200 is like the electronic circuit 100 of FIG. 1, except the electronic circuit 200 includes a different high voltage control circuit 202 that includes a different level shift circuit 204.

Various signal nodes are labeled with reference designators A-F that relate to the same reference designators and the same associated signals and associated nodes in figures that follow. As used herein, the reference designators A-F are used to identify signals or nodes interchangeably.

Figure 3:
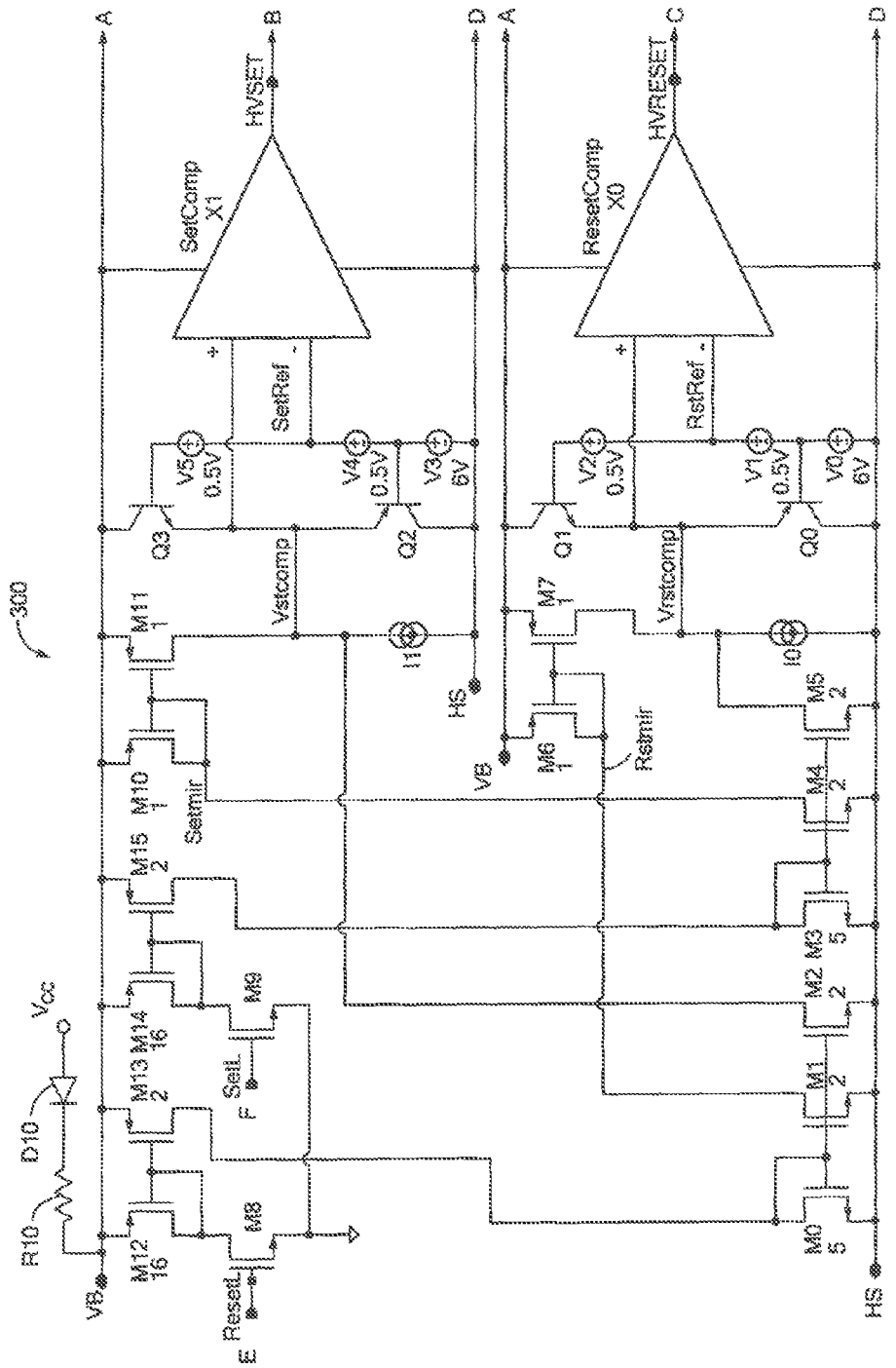
FIG. 3 is a block diagram showing an exemplary level shift circuit that can be used as the level shift circuit of FIG. 2.

Referring now to FIG. 3, an exemplary level shift circuit 300 can be used as the level shift circuit 204 of FIG. 2. The coupling to the power supply $V_{CC}$ is also shown, as is shown in FIG. 2.

Reference designators beginning with the letter M are used to identify NMOS and PMOS field effect transistors (FETS). Exemplary relative sizes of the NMOS and PMOS FETs are indicated by integers below the device reference designators. Reference designators beginning with the letter Q are used to identify bipolar transistors. Reference designators beginning with the letter V are used to identify voltage sources. Reference designators beginning with the letter I are used to identify current sources. Reference designators beginning with the letter X are used to identify comparators. Reference designators beginning with the letter R are used to identify resistors. Reference designators beginning with the letter D are used to identify diodes. A reference designator VB corresponds to the voltage VB described above in conjunction with FIGS. 1 and 2. The reference designator VB is also used herein to refer to a circuit node at which the voltage VB is present. A reference designator HS is used to describe the node HS described above in conjunction with FIGS. 1 and 2, which is the junction between two transistors arranged in a half bridge.

The level shift circuit 300 can include FETs M8, M9, which can be high voltage NMOS transistors, which can be the same as or similar to the FETs 2, 3 of FIG. 1.

Ultimately, a signal HVSET at reference designator B and a signal HVRESET at reference designator C connect to the set-reset latch 15 represented in FIG. 2. The bootstrap capacitor 16 of FIGS. 1 and 2 is also connected as shown in FIGS. 1 and 2, between the nodes A and D, but is not shown in FIG. 3.

A pulse signal SetL received at the node F comprises a pulse generated when the input signal (see e.g., FIGS. 1 and 2) is in a condition to turn on the high side transistor 17 of FIGS. 1 and 2. A pulse signal ResetL comprises a pulse generated when the input signal is in a condition to turn off the high side transistor 17. Both the pulse signal SetL and the pulse signal ResetL can be normally at ground.

Currents from the FETs M8 and M9 are mirrored by current mirrors M12/M13 and M14/M15, respectively, by current mirrors M0/M1/M2 (at M1) and M3/M4/M5 (at M4), respectively, and by current mirrors M6/M7 and M10/M11, respectively. The current mirror M0/M1/M2 also generates a current at M2 and the current mirror M3/M4/M5 also generates a current at M5, which currents are converted to voltages Vstcomp and Vrstcomp. The voltages Vstcomp and Vrstcomp are compared with reference voltages SetRef and RstRef, respectively, via comparators X1, X0 respectively.

The comparator X1 generates an output signal HVSET based on a difference between voltages Vstcomp and SetRef. The voltage SetRef is a bias voltage that can be close to mid-supply (e.g., 6.5 volts). Transistors Q2, Q3 limit the range of the voltage Vstcomp to approximately 6-7 volts. A current source I1 provides a small bias current (e.g., about five microamps) to clamp the voltage Vstcomp at about six volts and to maintain the voltage HVSET at a low logic level when no pulses are present in the signals ResetL and SetL at nodes E and F. Generation of the output signal HVRESET at the node C is similar to generation of the output signal HVSET at node B and it is also held low when no pulses are present in the signals ResetL and SetL at nodes E and F.

Current mirrors coupled in series are referred to herein as "composite current mirror circuits," or, more simply, a "composite current mirror." For example, the current mirror M12/M13, coupled to the current mirror M0/M1/M2, coupled to the current mirror M6/M7 is a composite current mirror. Also, the current mirror M14/M15, coupled to the current mirror M3/M4/M5, coupled to the current mirror M10/M11 is another composite current mirror.

While the composite current mirrors are shown to include three current mirrors coupled in series, a composite current mirror circuit can have any number of series connected current mirrors, but at least two series connected current mirrors.

The level shift circuit 300 is configured to drive an N-type transistor, e.g., the N-type transistor 17 of FIG. 2. The N-type transistor 17 has a control node (e.g., a base or gate), an output node (D, e.g., an emitter), and a power supply node (e.g., a collector) coupled to a high voltage supply (e.g., $V_{DD}$ of FIG. 2). The level shift circuit includes a bootstrap voltage node (e.g., node A) capacitively coupled (via the capacitor 16 of FIG. 2) to the output node (D, e.g., the emitter), of the N-type transistor 17. The level shift circuit 300 also includes a first input transistor M8, which can be either a FET or a bipolar transistor, having a control node (e.g., node E, a gate or a base), a current input node (e.g., a drain or a collector), and a current output node (e.g., a source or an emitter), wherein the control node (e.g., node E) is coupled to receive a first input signal ResetL. The level shift circuit 300 also includes a second input transistor M9 which can be either a FET or a bipolar transistor, having a control node (e.g., node F, a gate of a base), a current input node (e.g., a drain or a collector), and a current output node (e.g., a source or an emitter), wherein the control node (node F) is coupled to receive a second input signal SetL.

However, in other embodiments, as described below in conjunction with FIG. 6, it should be appreciated that the input signals ResetL, SetL can be reversed.

The level shift circuit 300 also includes a first composite current mirror circuit, M12/M13, M0/M1/M2, M6/M7, having a control node (e.g., drain of M12), a current input node (e.g., sources of M12 and M13), and a current output node (e.g., drain of M7). The control node (e.g., drain of M12) of the first composite current mirror circuit, M12/M13, M0/M1/M2, M6/M7 is coupled to the current input node (e.g., drain or collector) of the first input transistor M8, and the current input node (e.g., sources of M12 and M13) of the first composite current mirror circuit, M12/M13, M0/M1/M2, M6/M7, is coupled to the bootstrap voltage node (e.g., node A).

The level shift circuit 300 also includes a second composite current mirror circuit, M14/M15, M3/M4/M5, M10/M11, having a control node (e.g., drain of M14), a current input node (e.g., sources of M14, M15), and a current output node (e.g., drain of M11). The control node (e.g., drain of M14), of the second composite current mirror circuit M14/M15, M3/M4/M5, M10/M11 is coupled to the current input node (e.g., drain or collector) of the second input transistor M9, and the current input node (e.g., sources of M14 and M15) of the second composite current mirror circuit M14/M15, M3/M4/M5, M10/M11 is coupled to the bootstrap voltage node (e.g., node A).

It is shown that the first and second composite current mirror each include three current mirrors coupled in series. However, in other embodiments, as described below in conjunction with FIG. 5, it should be appreciated that the first and second composite current mirror can each include a different number of current mirrors.

The level shift circuit 300 also includes a first comparator X1 having a first input node coupled to the current output node (e.g., drain of M11) of the second composite current mirror circuit M14/M15, M3/M4/M5, M10/M11, and a second input node coupled to receive a first reference voltage SetRef. The first reference voltage SetRef is related to a voltage at the output node (e.g., emitter) of the N-type transistor 17. The first comparator X1 also has an output node.

The level shift circuit 300 also includes a second comparator X0 having a first input node coupled to the output node (e.g., drain of M7) of the first composite current mirror circuit, M12/M13, M0/M1/M2, M6/M7, and a second input node coupled to receive a second reference voltage RstRef. The second reference voltage RstRef is related to the voltage at the output node (e.g., emitter) of the N-type transistor 17. The second comparator X0 also has an output node.

In some embodiments, the first composite current mirror circuit, M12/M13, M0/M1/M2, M6/M7, includes a first current mirror M12/M13 having a control node (e.g., drain of M12), a current input node (e.g., sources of M12 and M13), and a current output node (e.g., drain of M13). The control node (e.g., drain of M12) of the first current mirror M12/M13 is coupled to the current input node (e.g., drain of M8) of the first input transistor M8, and the current input node (e.g., sources of M12 and M13) of the first current mirror M12/M13 is coupled to the bootstrap voltage node (e.g., node A).

In some embodiments, the first composite current mirror circuit, M12/M13, M0/M1/M2, M6/M7, also includes a second current mirror M0/M1/M2 having a control node (e.g., drain of M0) a current input node (e.g., drain of M1) and a current output node (e.g., sources of M0 and M1). The control node (e.g., drain of M0) of the second current mirror M0/M1/M2 is coupled to the current output node (e.g., drain of M13) of the first current mirror M12/M13, and the current output node (e.g., sources of M0 and M1) of the second current mirror M0/M1 is coupled to the output node (e.g., node D) of the N-type transistor 17.

In some embodiments, the first composite current mirror circuit, M12/M13, M0/M1/M2, M6/M7, also includes a third current mirror M6/M7 having a control node, (e.g., drain of M6), a current input node (e.g., sources of M6 and M7), and a current output node (e.g., drain of M7). The control node (e.g. drain of M6) of the third current mirror M6/M7 is coupled to the current input node (e.g., drain of M1) of the second current mirror M0/M1, the current input node (e.g., sources of M6 and M7) of the third current mirror M6/M7 is coupled to the bootstrap voltage node (e.g., node A), and the current output node (e.g., drain of M7) of the third current mirror M6/M7 is coupled to the first input node of the second comparator X0.

In some embodiments, the second composite current minor circuit M14/M15, M3/M4/M5, M10/M11, includes a fourth current mirror M14/M15 having a control node (e.g., drain of M14), a current input node (e.g., source of M14 and M15), and a current output node (e.g., drain of M15). The control node (e.g., drain of M14) of the fourth current mirror M14/M15 is coupled to the current input node (e.g., drain) of the second input transistor M9, and the current input node (e.g., sources of M14 and M15) of the fourth current mirror M14/M15 is coupled to the bootstrap voltage node (e.g., node A).

In some embodiments, the second composite current mirror circuit M14/M15, M3/M4/M5, M10/M11, also includes a fifth current mirror M3/M4/M5 having a control node (e.g., drain of M3) a current input node (e.g., drain of M4), and a current output node (e.g., sources of M3, M4, and M5). The control node (e.g., drain of M3) of the fifth current mirror M3/M4/M5 is coupled to the current output node (e.g., drain of M15) of the fourth current mirror M14/M15, and the current output node (e.g., sources of M3, M4, and M5) of the fifth current mirror M3/M4/M5 is coupled to the output node (e.g., node D) of the N-type transistor 17.

In some embodiments, the second composite current mirror circuit M14/M15, M3/M4/M5, M10/M11, also includes a sixth current mirror M10/M11 having a control node (e.g., drain of M10), a current input node (e.g., sources of M10 and M11), and a current output node (e.g., drain of M11). The control node (e.g., drain of M10) of the sixth current mirror M10/M11 is coupled to the current input node (e.g., drain of M4) of the fifth current mirror M3/M4. The current input node (e.g., sources of M10 and M11) of the sixth current mirror M10/M11 is coupled to the bootstrap voltage node (e.g., node A). The current output node (e.g., drain of M11) of the sixth current mirror M10.M11 is coupled to the first input node of the first comparator X1.

In some embodiments, the second current mirror M0/M1/M2 further includes a second current input node (e.g., drain of M2). The second current input node (e.g., drain of M2) of the second current mirror M0/M1/M2 is coupled to the first input node of the first comparator X1. In some embodiments, the fifth current mirror, M3/M4/M5, further includes a second current input node (e.g., drain of M5). The second current input node (e.g., drain of M5) of the fifth current mirror M3/M4/M5 is coupled to the first input node of the second comparator X0.

In some embodiments, the level shift circuit 300 includes a first current generator I1 coupled between the first input node of the first comparator X1 and the output node (e.g., node D) of the N-type transistor 17, and a second current generator I0 coupled between the first input node of the second comparator X0 and the output node (e.g., node D) of the N-type transistor 17.

In some embodiments, the level shift circuit 300 also includes a first transistor Q2 having an emitter coupled to the first input node of the first comparator X1 and a collector coupled to the output node (e.g., node D) of the N-type transistor 17 (FIG. 2). In some embodiments, the level shift circuit 300 also includes a second transistor Q0 having an emitter coupled to the first input node of the second comparator X0 and an collector coupled to the output node (e.g., node D) of the N-type transistor 17.

In some embodiments, the level shift circuit 300 also includes a third transistor Q3 having a collector coupled to the bootstrap voltage node (e.g., node A), and an emitter coupled to the emitter of the first transistor Q2. In some embodiments, the level shift circuit 300 also includes a fourth transistor Q1 having a collector coupled to the bootstrap voltage node (e.g. node), and an emitter coupled to the emitter of the second transistor Q0.

In some embodiments, the level shift circuit 300 can include a first series string of three voltage sources V5, V4, V3 coupled to control nodes (e.g., bases) of the first and third transistors Q2, Q3, and to the second input node of the first comparator X1. In some embodiments, the level shift circuit 300 can include a second series string of three voltage source V2, V1, V0 coupled to control nodes (e.g., bases) of the second and fourth transistors Q0, Q1, and to the second input node of the first comparator X1.

A power supply voltage $V_{CC}$, e.g., fifteen volts, can be received at a cathode end of a diode D10. An anode end of the diode D10 can be coupled to one end of a resistor R10, and the other end of the resistor R1 can be coupled to the bootstrap voltage node (e.g. node A). In this way, it should be understood that when the bootstrap voltage node is sent toward zero volts by way of the capacitor 16 of FIG. 2, then the bootstrap voltage node is held near fifteen volts. Also, when the bootstrap voltage node (e.g., node A) is sent toward a high voltage, e.g., six hundred volts, the bootstrap voltage node will achieve a voltage of six hundred fifteen volts.

In operation, first assume a high state SetL pulse is received at the gate of the FET M9, while ResetL at the gate of the FET M8 is held low, e.g., at ground. In this condition, the FET M9 is turned on and its drain current can be reduced (see relative sizes of FETs denoted by numbers) through the combination of the fourth current mirror M14/15 and the fifth current mirror M3/M4/M5 by a factor of about 20. The drain current of the FET M4 is mirrored by the current mirror M10/M11. No current is generated in the current mirror M0/M1/M2, or in the current mirror M6/M7. Drain current of the FET M11 exceeds current of the current generator I1 and causes the voltage Vstcomp to rise and clamp at about seven volts when the first transistor Q2 turns on. In this state, the voltage Vstcomp is greater than the reference voltage SetRef, and accordingly, the first comparator X1 generates the output signal HVSET with a high state. Also in this condition, current through the FET M5 adds to current of the second current generator I0, while no current is provided by the FET M7. Thus, the signal Vrstcomp is clamped at 6V and the output signal HVRESET from the second comparator X0 remains low.

The drain current from the FET M5 is much larger than the current from the second current generator which increases the noise immunity of the HVRESET path when input signals are present. In a similar manner a logic high signal will be generated on HVRESET and a logic low on HVSET when a pulse appears on the ResetL signal with the SetL signal held low.

The common-mode transient signal described above in conjunction with FIG. 1 is presented to the FETs M8, M9 when the bootstrap voltage node (e.g., node A) experiences a rapid increase in voltage. Due to the common-mode transient signal, it may be possible for the output signals HVSET, HVRESET of the first and second comparators X1, X0, respectively, to both temporarily achieve a logic high state even with no high state of SetL or ResetL input signals. However, it should be understood that, unlike the arrangement of FIG. 2, the FETs M8, M9, are coupled to receive currents from current mirrors M12/M13, M14/M15, respectively.

Regarding common-mode transient signals, referring briefly to FIG. 2, if the low side transistor 18 is sinking current from the load 21, when it is turned off, even before the transistor 17 is turned on voltage at the node HS will "fly up" until a diode D1 forward biases. This is particularly true for an inductive load 21, for which a current through the load cannot instantaneously turn off.

Returning to FIG. 3, this fly-up common mode voltage is applied to the drain capacitances of the FETs M8, M9, which will draw respective common mode currents from the two current mirrors M12/M13 and M14/M15. Essentially, the common mode voltage appears on the drains of the FETs M8, M9 through M12, M14, respectively, which are diode connected between VB and the drains. However, the leading edge (i.e., rising edge) of the common mode voltage does not propagate well through the level shift circuit 300. Essentially, delays through the current mirrors M6/M7 and M10/M11 ensure a low signal at the first input nodes of the first and second comparators X1, X2, even during the leading edge of the common mode voltage. However, on the falling edge of the common mode voltage, delay through the current mirror M10/M11 causes current through the FET M11 to momentarily exceed current through the FET M2, which tends to generate a false high state of the HVSET signal at the output of the first comparator X1. Similarly, a high state of the HVRESET signal is also generated simultaneously due to delay through the current mirror M6/M7. These false transients of the output signals HVSET and HVRESET will continue until the common mode current falls below the offsets generated by the first and second current generators I1, I0.

Though the false glitches of the output signals HVSET and HVRESET still occur, as they do in the conventional circuit of FIG. 1, duration of the false glitches is less. In some embodiments, the false glitches of the output signals HVSET and HVRESET can be reduced or eliminated in the level shift circuit 300 by ensuring that the current generators I0, I1 supply sufficient current to overcome the transient voltages that appear at Vrstcomp and Vstcomp, respectively.

A primary advantage of the level shift circuit 300 over prior art described above in conjunction with FIG. 1 is that the translation depends on comparison of differential currents at the two comparators X1, X0. Even in the presence of large common mode voltages at the FETs M8, M9, sufficient differential currents exist to resolve the voltage signals Vstcomp and Vrstcomp.

Figure 4:
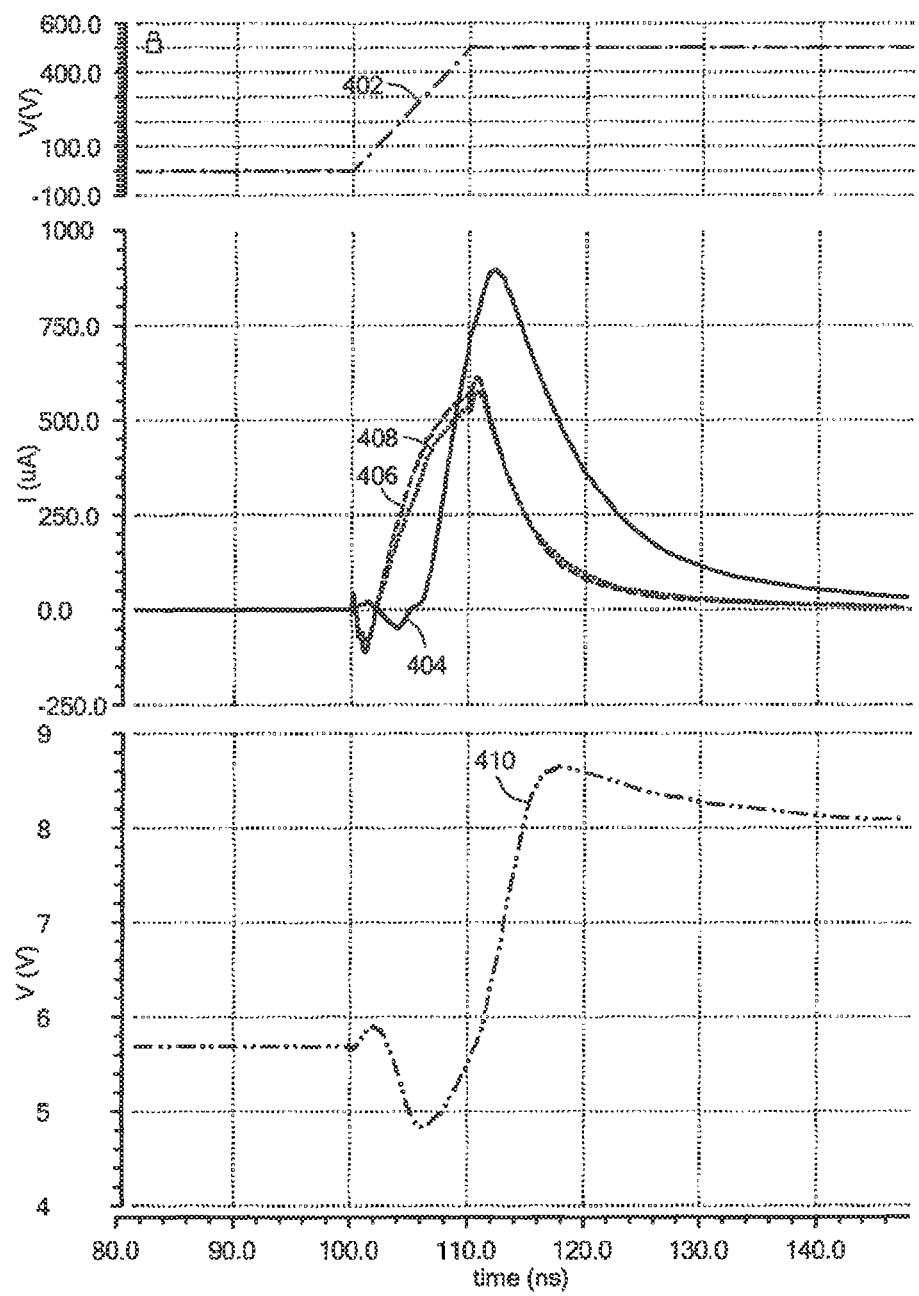
FIG. 4 is a graph showing certain signals within the level shift circuit of FIG. 3.

Referring now to FIG. 4, a graph has a horizontal axis with a scale in units of time in nanoseconds and a vertical axis with scales in units of voltage in volts and in units of current in microamps. A signal 402 is representative of the voltage at the bootstrap voltage node (node A of FIG. 3) when the voltage steps upward when the transistor 17 turns on. In this example, the voltage steps up from about zero volts to about five hundred volts in about ten nanoseconds while the signal SetL and ResetL of FIG. 3 are held low.

A signal 404 is representative of a corresponding current signal at the FET M11 (FIG. 3). A signal 406 is representative of a current signal at the FET M2, and a signal 408 is representative of a current at the FET M4. It will be recognized that the current spike at the FET M11 is delayed from the current spikes at the FETs M2, M4.

The currents of the signals 406, 408 are larger than the current of the current generator I1 of FIG. 3, and thus, the signal Vstcomp at the first input node of the first comparator X1 rises above the signal SetRef (about 6.5 Volts) at the second input node of the first comparator X1.

A signal 410 is representative of a corresponding transient voltage signal in the signal Vstcomp at the first input node of the first comparator X1 of FIG. 2. As described above, the signal Vstcomp is compared with the signal SetRef (about 6.5 volts) at the first comparator X1. The signal 410 stays above the signal SetRef until the signal 404 falls below the signal 408, or until both signals drop below the current of the current generator I1 of FIG. 3, resulting in the output signal HVSET from the first comparator X1 taking on a high state. Thus, the high transient value of the signal 410 is undesirable.

In some embodiments, the transients can be mitigated as described above, by making the offset currents I0 or I1 sufficiently large. Alternatively, the circuit 300 can be modified as in FIG. 5 or 6 below, both of which show circuits that avoid the increase in power dissipation associated with the current generators I0 and I1. Thus the circuits described below in conjunction with FIGS. 5 and 6 are improvements upon the circuit 300 of FIG. 3.

Figure 5:
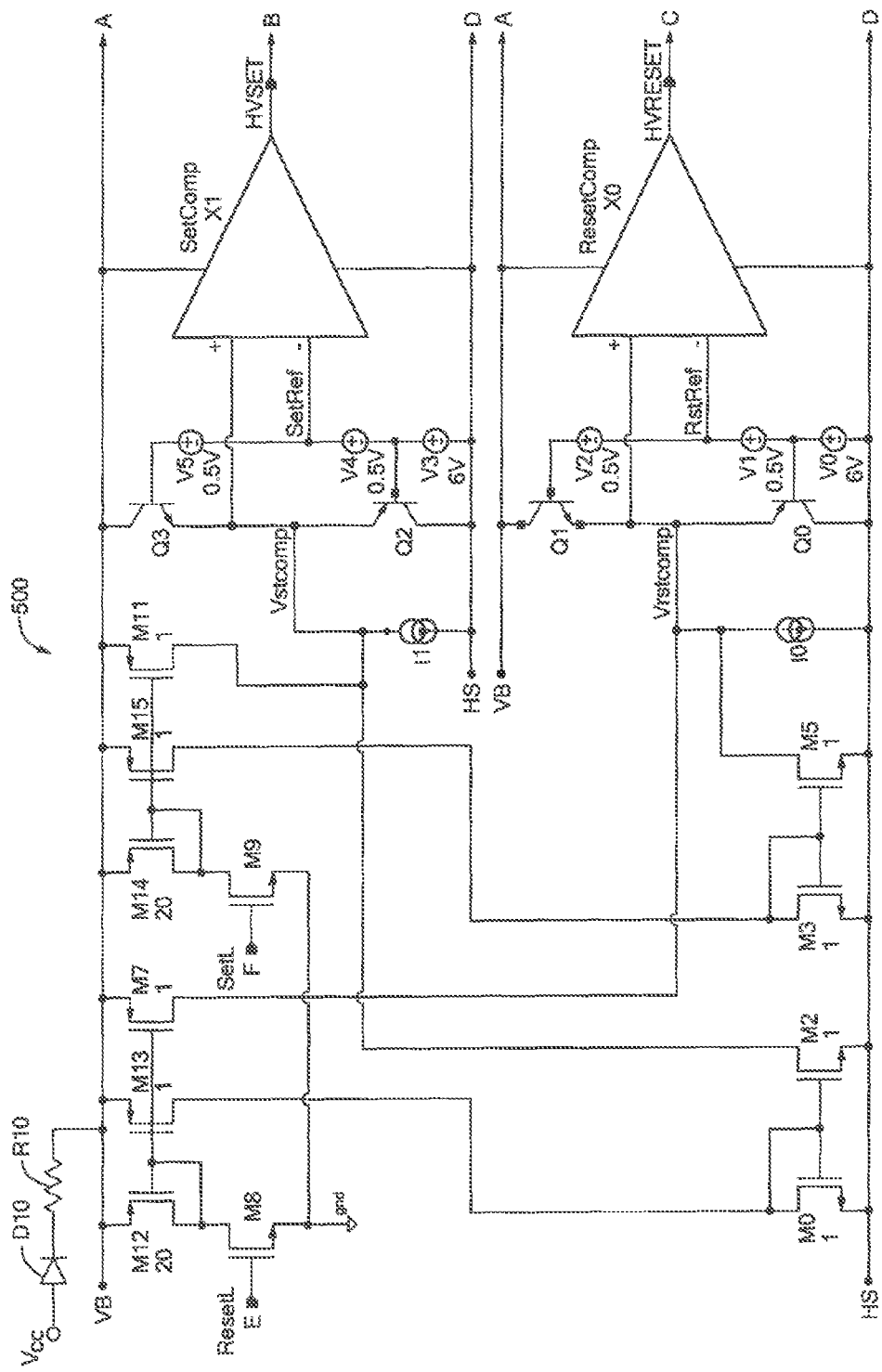
FIG. 5 is a block diagram showing another exemplary level shift circuit that can be used as the level shift circuit of FIG. 2.

Referring now to FIG. 5, in which like elements of FIGS. 1, 2, and 3 are shown having like reference designations, another exemplary level shift circuit 500 is similar to the level shift circuit 300 of FIG. 3. Here, however, the first and second composite current mirror circuits described above in conjunction with FIG. 3, each having three current mirrors, are replaced by composite current mirror circuits having two current mirrors.

Function, of the level shift circuit 500 is similar to function described above in conjunction with FIGS. 3 and 4, and thus, is not described in detail herein.

Figure 6:
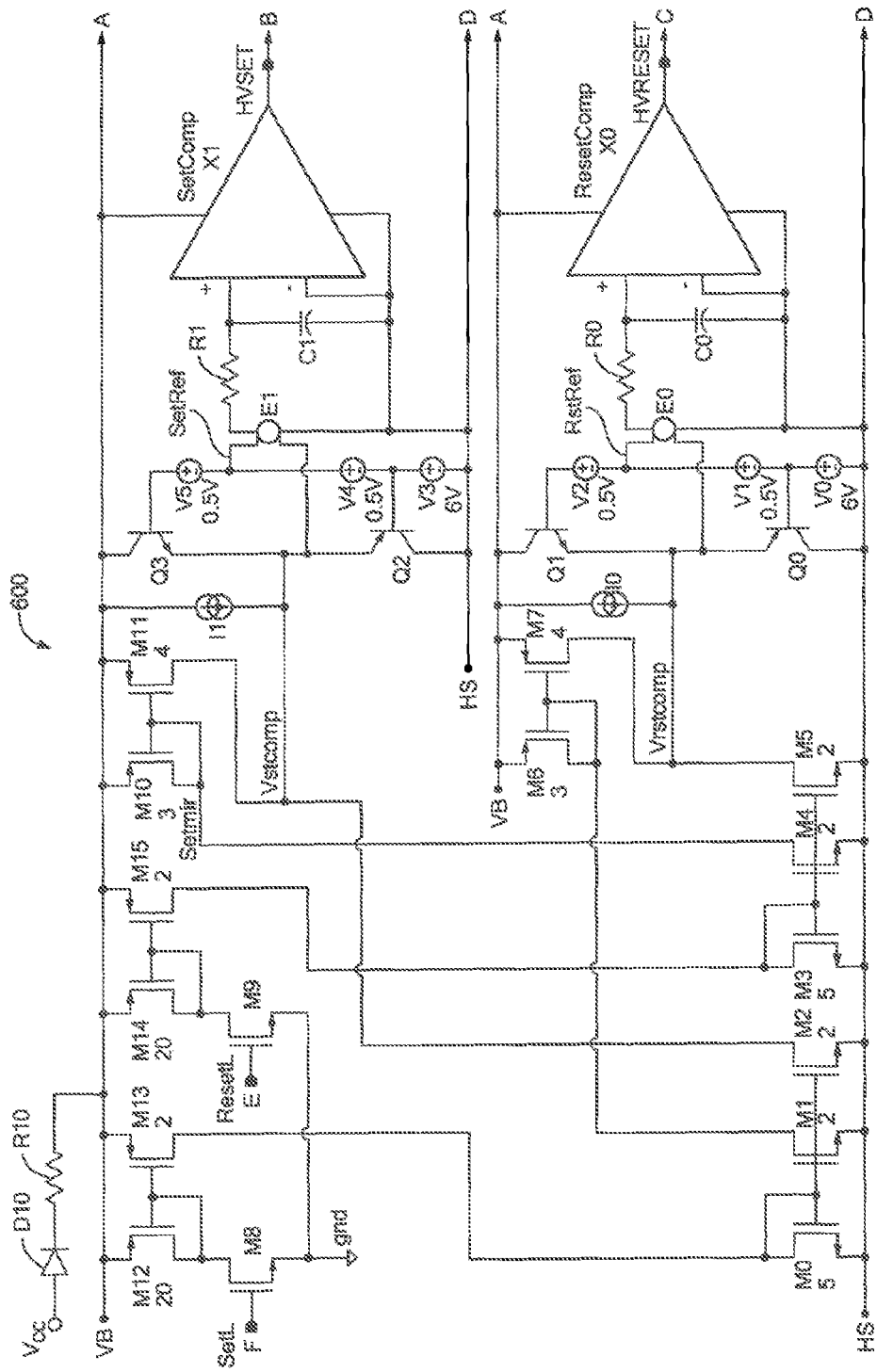
FIG. 6 is a block diagram showing another exemplary level shift circuit that can be used as the level shift circuit of FIG. 2.

Referring to FIG. 6, in which like elements of FIGS. 1, 2, and 3 are shown having like reference designations, another exemplary level shift circuit 600 is similar to the level shift circuit 300 of FIG. 3. Here, however, positions of the first and second current generators I1, I0 are changed, inputs nodes E, F and corresponding signals ResetL, SetL are reversed, and low pass filters described below are added at the inputs to the comparators X1, X0. Also, the current mirrors M6/7 and M10/11 are modified from the 1:1 ratio of FIG. 3 to a 3:4 ratio, as identified by numbers under the associated reference designators.

The first current generator I1 is coupled between the bootstrap voltage node (e.g., node A) and the current output node of the sixth current mirror M10/M11. The second current generator I0 is coupled between the bootstrap voltage node (e.g., node A) and the current output node of the third current mirror M6/M7.

A first voltage-to-voltage converter E1 can be coupled between the first comparator X1 and the signals Vstcomp and SetRef, and a second voltage-to-voltage converter E0 can be coupled between the second comparator X0 and the signals Vrstcomp and RstRef.

Also optionally, a first low pass filter comprised of a resistor R1 and a capacitor C1 can be coupled between the first and second input nodes of the first comparator X1, and a second low pass filter comprised of a resistor R2 and a capacitor C2 can be coupled between the first and second input nodes of the second comparator X0.

The first voltage-to-voltage converter E1 can be operative to essentially pass a difference between the signals Vstcomp and SetRef, with an inversion, as a difference between the first (i.e., positive) input of the first comparator X1 and the second (i.e., negative) input of the first comparator X1. Filtering is also added as shown. Similarly, the second voltage-to-voltage converters E0 can be operative to essentially pass a difference between the signals Vrstcomp and RstRef, with an inversion, as a difference between the first (i.e., positive) input of the second comparator X0 and the second (i.e., negative) input of the second comparator X0, with filtering. It should be appreciated that, when a SetL pulse occurs, the Vstcomp signal is pulled negatively relative to the SetRef signal and when a ResetL pulse occurs, the Vrstcomp signal is pulled negatively relative to the RstRef signal.

Reasons for the reversals of various signals will be understood from the discussion below in conjunction with FIG. 7.

Figure 7:
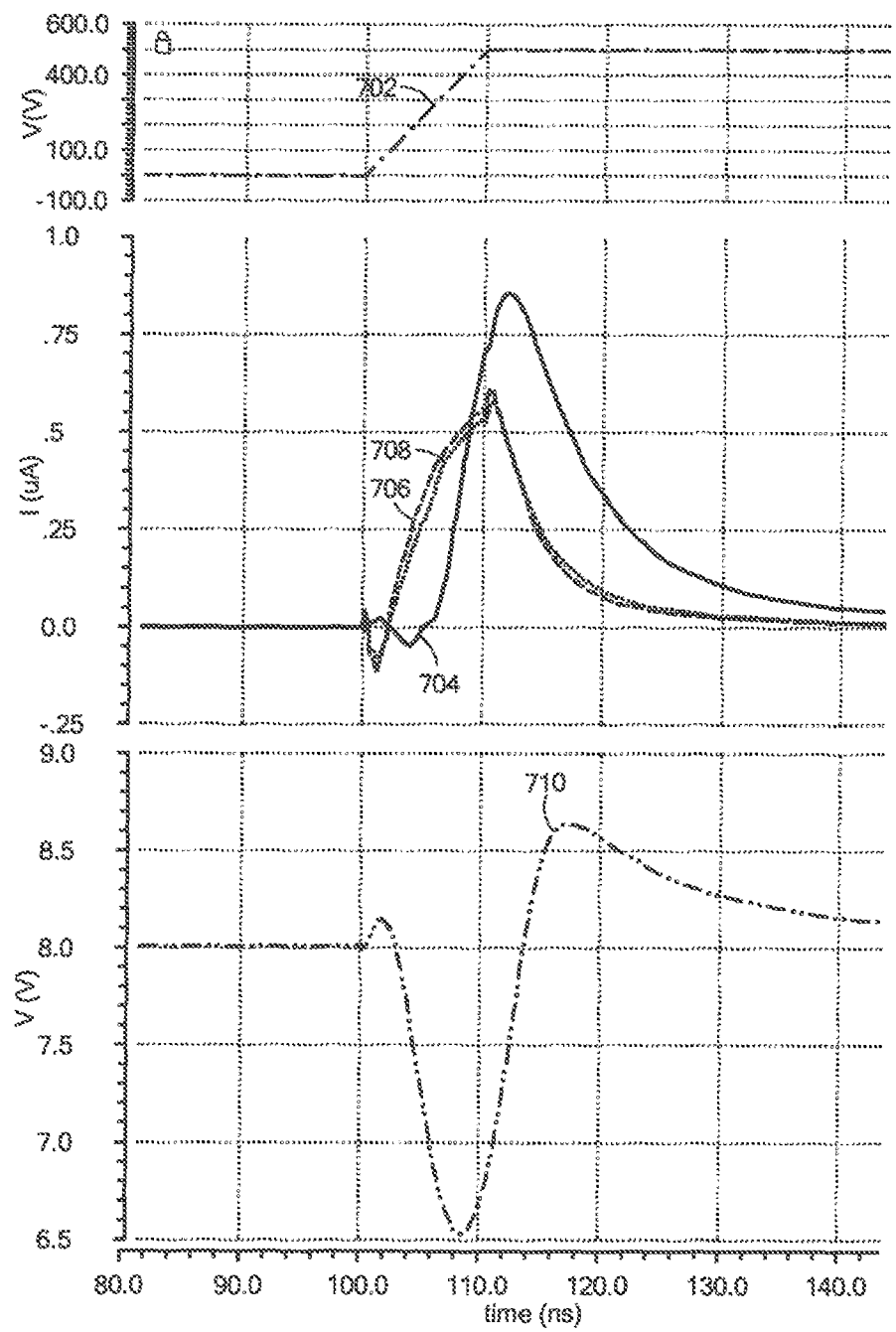
FIG. 7 is a graph showing certain signals within the level shift circuit of FIG. 6.

Referring now to FIG. 7, a graph has a horizontal axis with a scale in units of time in nanoseconds and a vertical axis with scales in units of voltage in volts and in units of current in microamps. A signal 702 is representative of the voltage at the bootstrap voltage node (node A of FIG. 3) when the voltage steps upward, in this example, from about zero volts to about five hundred volts in about ten nanoseconds, while the signal SetL and ResetL of FIG. 6 are held low.

A signal 704 is representative of a corresponding current signal at the FET M11. A signal 706 is representative of a current signal at the FET M2, and a signal 708 is representative of a current at the FET M4. It will be recognized that the current spike at the FET M11 is delayed from the current spikes at the FETS M2, M4.

As described above, the first current generator I1 in the level shift circuit 600 of FIG. 6 is coupled differently than the first current generator I1 is coupled in the level shift circuit 300 of FIG. 3.

A signal 710 is representative of a corresponding transient voltage signal in the signal Vstcomp at the first input node of the first comparator X1 of FIG. 2. As described above, the signal Vstcomp is compared with the signal SetRef (about 6.5 volts) at the first comparator X1. The signal 710 stays above the signal SetRef, resulting in the output signal HVSET from the first comparator X1 remaining low. Thus, the low transient value of the signal 710 is acceptable.

A difference between the current 704 through the FET M11 and the current 706 though the FET M2 determines the signal 710. When the current 704 is larger than the current 706, the signal Vstcomp will be positive relative to the signal SetRef. Therefore, on the leading edge of the signal 706, the current 704 is less than current 706, resulting in the signal Vstcomp being less than the signal SetRef, as indicated in the signal 710. However, this transient condition has a short duration and can be filtered out by the RC filter R1, C1. At the trailing edge of the current 706, the current 704 is greater than the current 706, resulting in the signal Vstcomp being greater than the signal SetRef. The current generator I1 serves to ensure that the signal Vstcomp is greater than the signal SetRef during the absence of transients.

Comparing the negative going transient voltage signal 710 with the positive going transient voltage signal 410 of FIG. 4, it will also be recognized that the negative going transient voltage signal 710 has a much shorter duration than the positive going transient voltage signal 410. Thus, any effect upon the output signals HVSET and HVRESET will be shorter for the level shift circuit 600 than for the level shift circuit 300.

Furthermore, because the negative going transient signal 710 has a short duration, the first filter coupled between the input nodes of the first comparator X1 can effectively filter out the negative going transient signal 710.

It should also be understood that the mirror ratio of 3:4 (see numbers under the reference designators) in the current mirrors M10/M11 and M6/M7 improves the immunity to common mode signals. For example, a common mode current of M2 will equal that of M4. Because of the 3:4 ratio, current in the FET M11 will be larger than current in the M2 FET, which helps to ensure that the signal Vstcomp is greater than the signal SetRef.

Referring now to FIGS. 5A and 5B together, in which like elements of FIGS. 1, 2, and 3, and 6 are shown having like reference designations, another exemplary level shift circuit 800 is similar to the level shift circuit 600 of FIG. 6. Here, however, first second third and fourth transistors Q2, Q0, Q3, Q1, respectively, are replaced by corresponding FETs. Also, additional FETS M20, M21 are added. Still further, voltage sources V5, V4, V3, V2, V1, V0 are replaced by zener diodes D2, D3, D1, D0 and associated decoupling capacitors C2, C3. Also, current mirrors M22/M23, M18/M19 are added. Also, current sources I2, I3 are added to provide bias currents for the diodes D0, D1, D2, D3. Also, zener diodes D4, D5, D6, D7 are added. Also, resistors R2, R3, R4, R5 are added.

In some integrated circuit fabrication technologies, for example, in a so called bipolar CMOS DMOS (BCD) process, it is not possible to implement the first and second transistors Q2, Q0 of FIG. 6 as PNP transistors. Essentially, the base of PNP transistors using the BCD process is a buried N-layer which forms the substrate isolation for the high voltage region. Also, the third and fourth transistors Q3, Q1 of FIG. 6, which are NPN transistors, may require large base current bias for fast operation.

Thus, FETS M24, M17, M25, M16 replace the above-described bipolar transistors.

The new current mirrors M18/M19 and M22/M23 increase charging current to the gates of the MOSFET clamps when a SetL or ResetL pulse arrives. The above changes limit the range of the voltage signals Vstcomp and Vrstcomp from about six volts to about nine volts.

The new zener diodes D4, D5, D6, D7 prevent transient drain voltage (due to the above-described common mode voltage) on the current mirrors M12/13, M14/M15 from exceeding breakdown limits (to body or gate). Also, the resistors R2, R3, R4, R5 reduce current overshoot. The resistors R2, R3, R4, R5 are sized along with the zener diodes D4, D5, D6, D7 so that current is shared between the zener diodes and PMOS transistors M12, M14. The device sizes are also selected to reduce delay though the current mirrors M12/M13, M14/M15. In the presence of the common mode voltage and resulting common mode currents, sufficient differential current is available to resolve the SetL and ResetL inputs under all conditions.

The relatively slow voltage transition through the reference voltages of the first and second comparators X1, X2, due in part to the low pass filters R1/C1, R0/C0, affects speed of the output signals HVSET, HVRESET of the comparators X1, X0 and causes the delay of the comparators X1, X0 to vary over process, temperature, and supply voltage. This effect is mitigated by techniques described below in conjunction with FIG. 10.

Figure 8A:
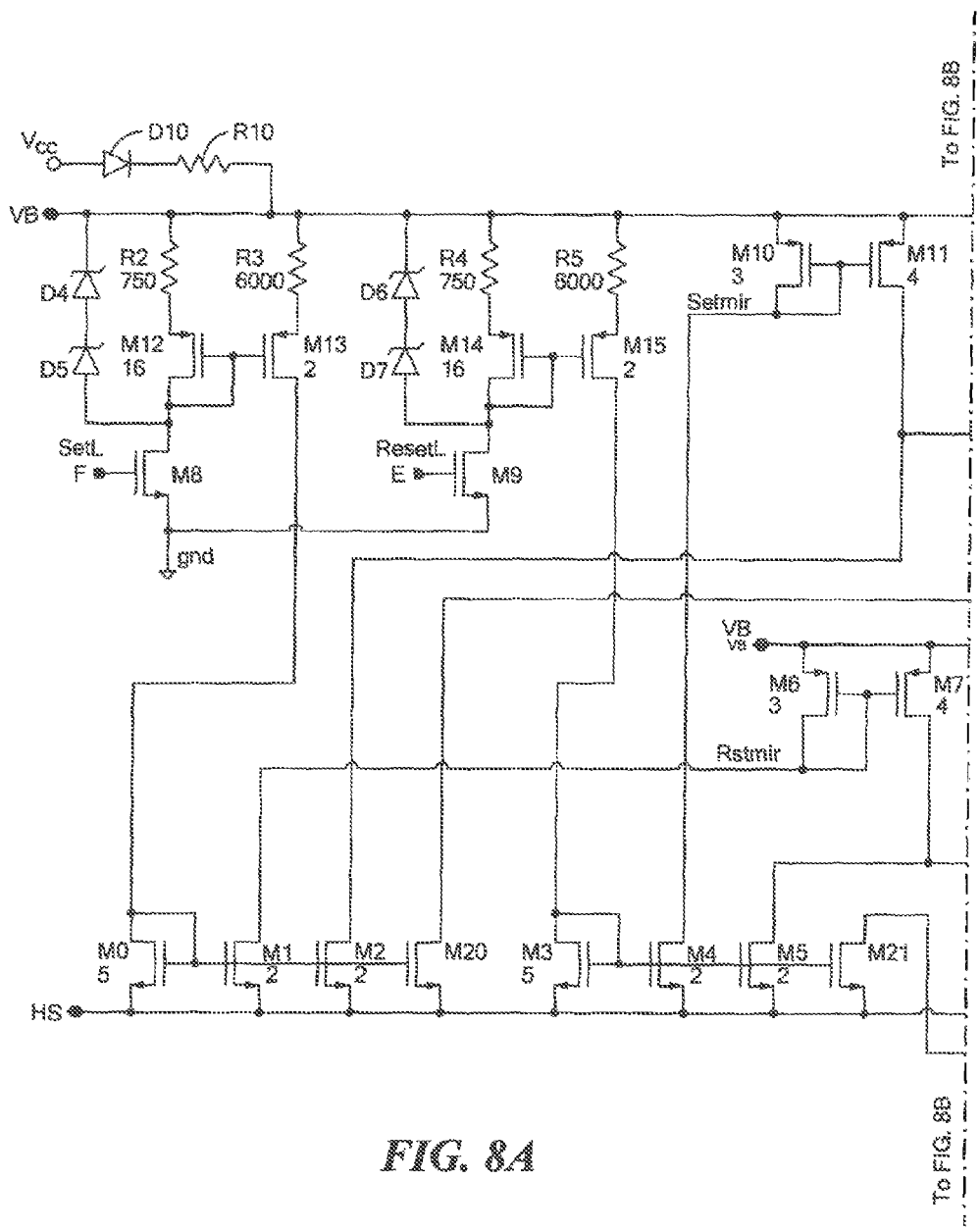
FIGS. 8A and 8b taken together are a block diagram showing another exemplary level shift circuit that can be used as the level shift circuit of FIG. 2.
Figure 8B:
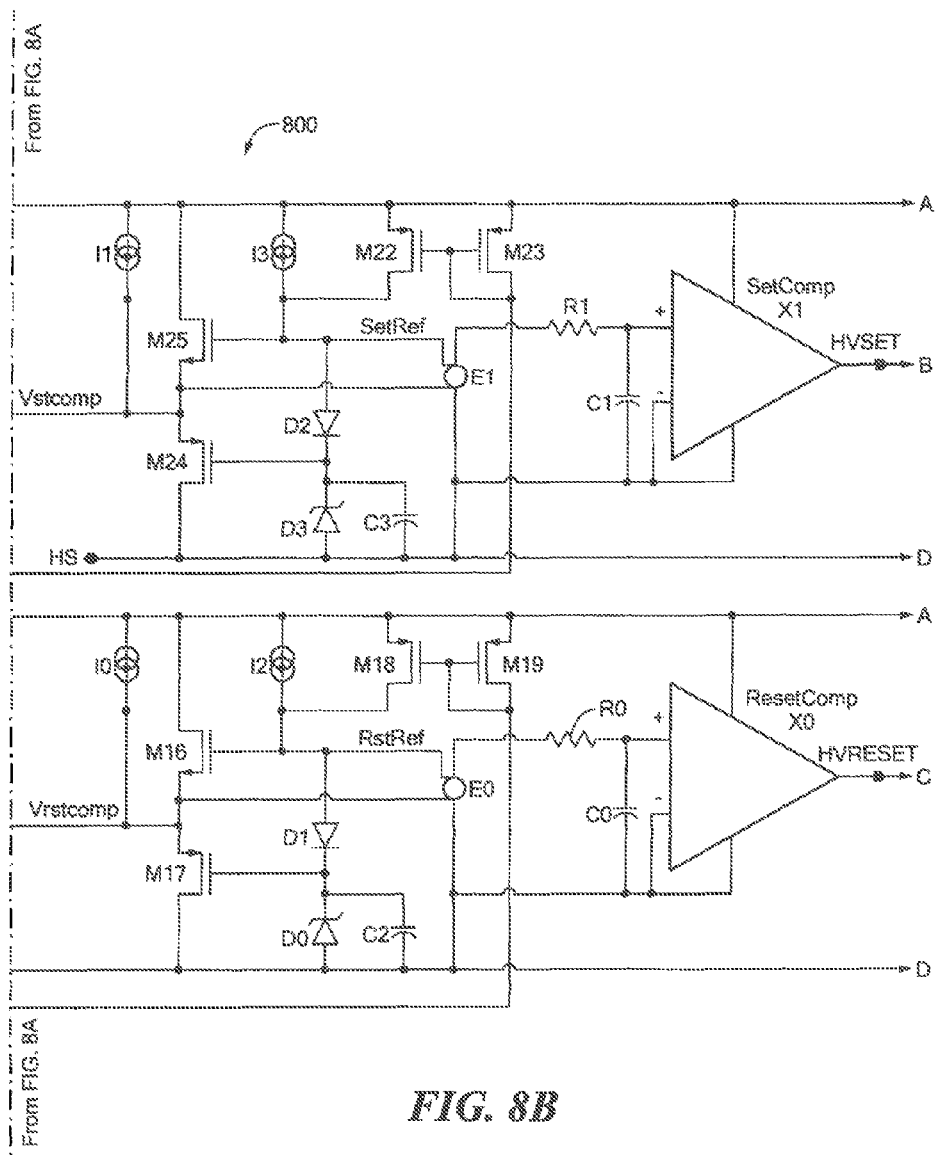
Figure 9A:
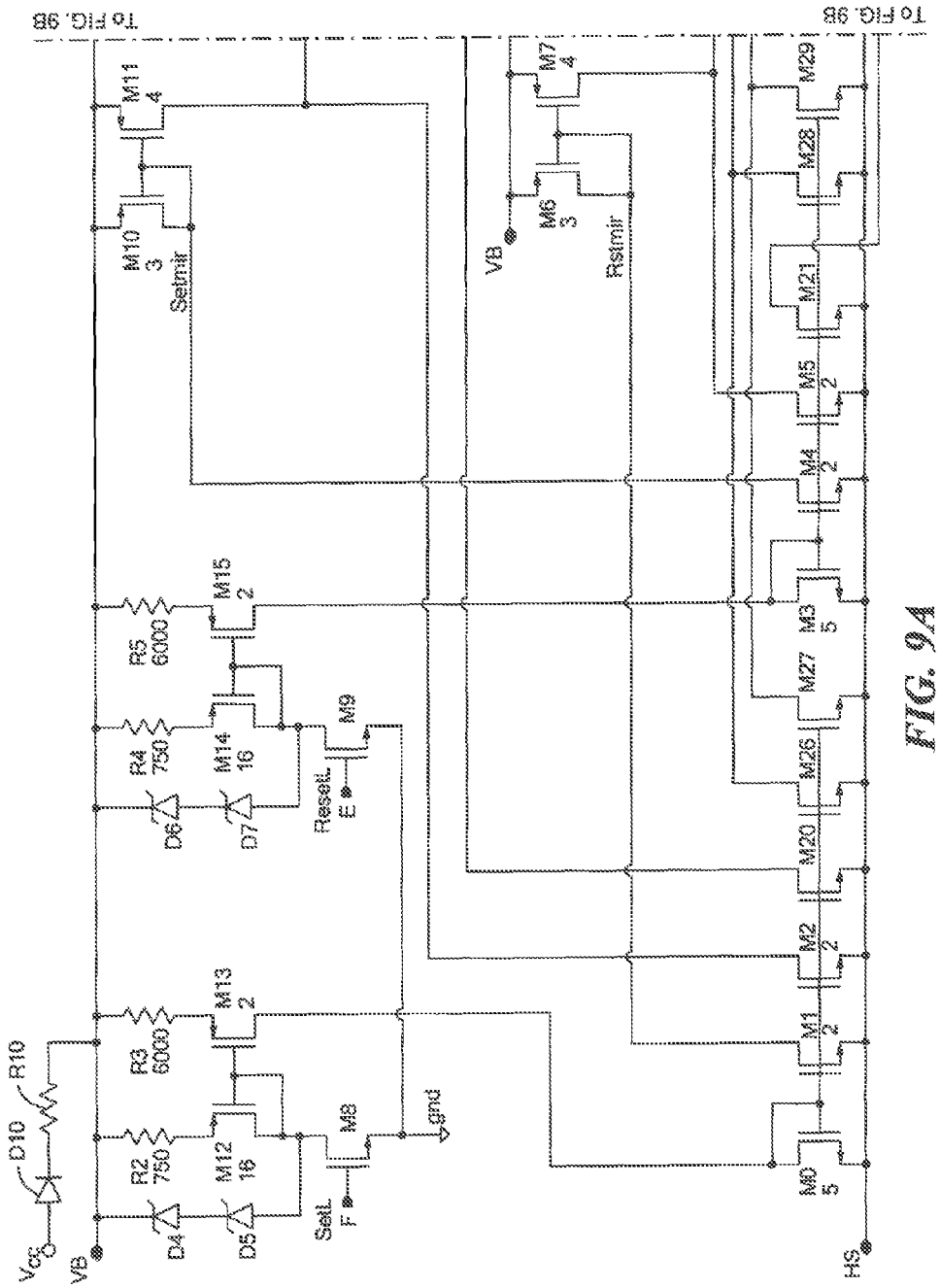
FIGS. 9A and 9B taken together are a block diagram showing another exemplary level shift circuit that can be used as the level shift circuit of FIG. 2.
Figure 9B:
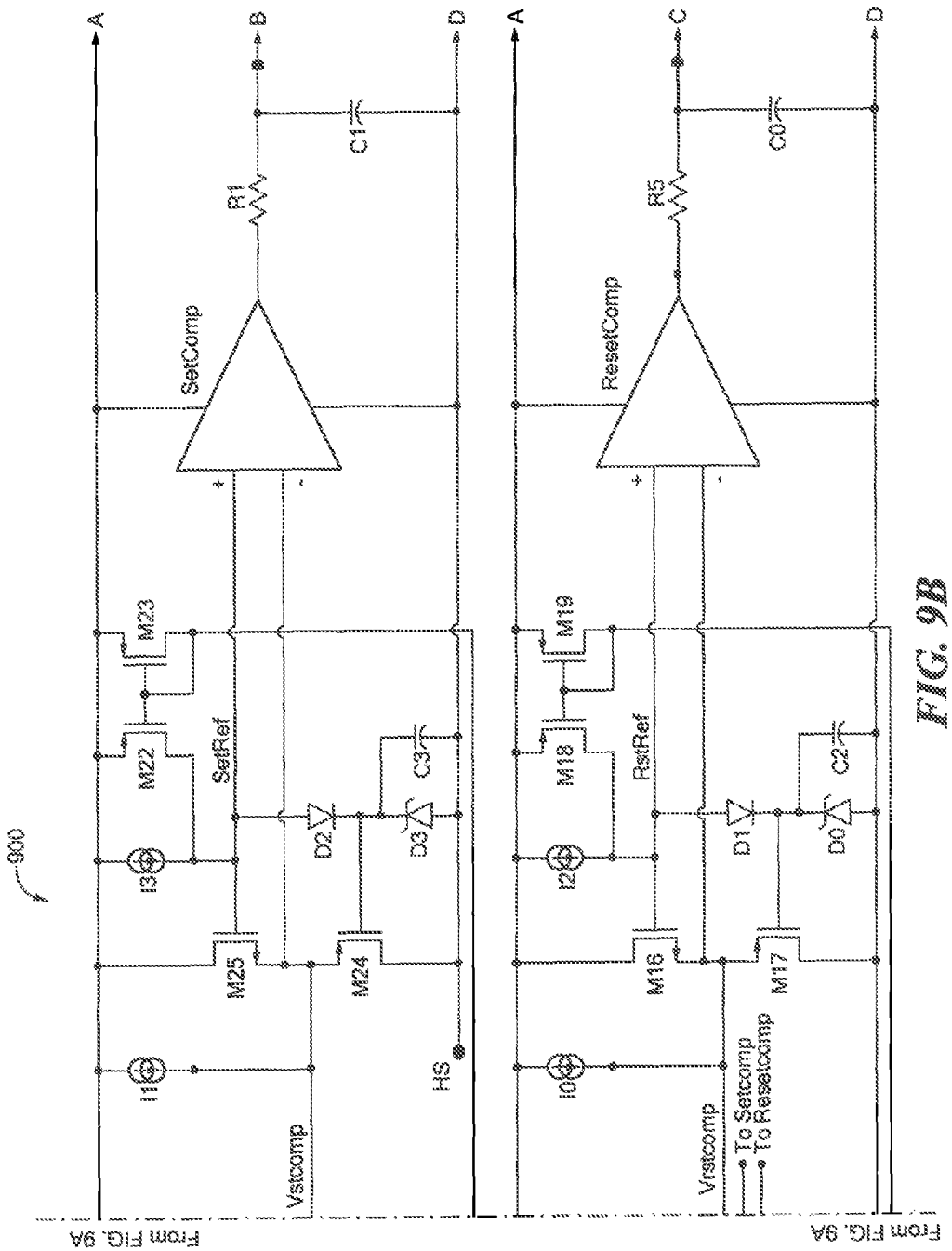

Referring now to FIGS. 9A and 9B together, in which like elements of FIGS. 2, 3, 6 and 8 are shown having like reference designations, a level shift circuit 900 is similar to the level shift circuit 800 of FIG. 8. Here, however, the low pass filters R1/C1, R0/C0 are moved to the output sides of the comparators X1, X0, respectively. Also, FETS M26, M27, M28, M29 are added.

The output of the comparators X1, X0 swing from the voltage at the node HS the node D) to the voltage V13 at the node A, so the RC filters are still effective even though the voltage signals Vstcomp and Vrstcomp transition rapidly past the reference voltages SetRef, RstRef, respectively.

Drain currents of the FETs M26, M28 are summed and applied to the first comparator X1 (coupling not shown). Likewise, drain current of the FETs M27, M29 are summed and applied to the second comparator X0 (coupling not shown). Couplings of these signals to the comparators are described below in conjunction with FIG. 10.

Figure 10:
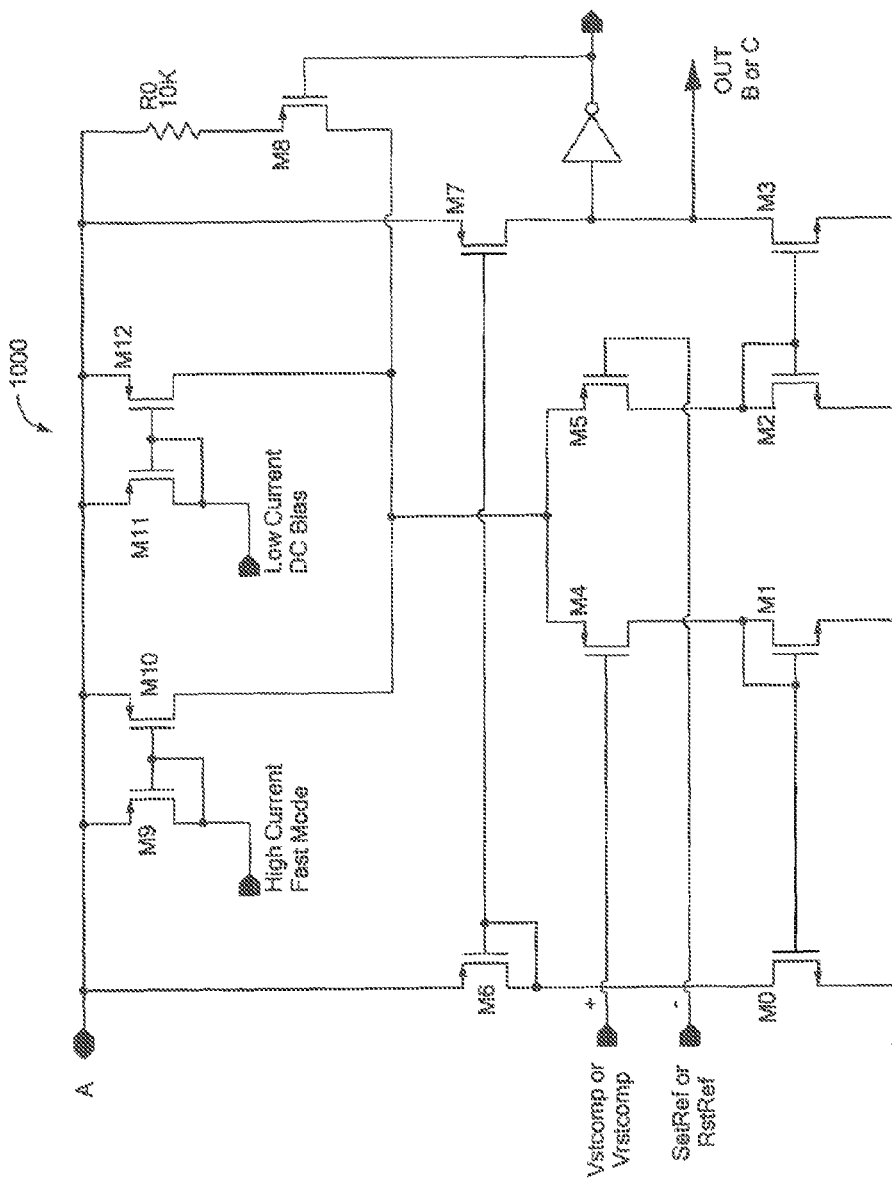
FIG. 10 is a block diagram of a two-speed comparator that can be used to form each of two comparators within the level shift circuits of FIGS. 3, 5, 6, 8, and 9

Referring now to FIG. 10, an exemplary comparator 1000 can be used as each one of the comparators X1, X0 of FIGS. 2, 3, 5, 6, 8, and 9. At some times, the comparator 1000 receives a small DC bias current (e.g., five microamps) by way of a current mirror M11/M12, which is controlled by a signal identified as "Low Current DC Bias." At other times, for example, when a SetL or ResetL pulse is applied to the above-described level shift circuits, the speed of the comparator 1000 can be is increased by way of a higher bias current (e.g., one hundred fifty microamps) provided by a current mirror M9/M10.

In operation, the current mirror M9/M10 can be controlled by one of the signals from a respective one of the pairs of FETS M26, M28 or the FETS M27, M29 of FIG. 9. It will be understood that the higher bias current can speed up the comparator 1000 when the comparator must make a transition in its output signal.

For the SetComp comparator, i.e., the first comparator X1 of FIGS. 3, 5, 6, 8, and 9, the voltage signal Vstcomp is connected to the input node so labeled in FIG. 10 and the voltage reference signal SetRef is connected to the input node so labeled in FIG. 10. Thus, in the steady state, the output of the first comparator X1 is logic low, and the output is logic high when a SetL pulse is present. At the termination of a SetL pulse, the high current fast mode described above is disabled before the pulse propagates to the output. To maintain fast operation, the gate of a FET M8 is coupled to the output at nodes B or C though an inverter. The drain current of M8 is routed to the comparator input pair, and holds the comparator in fast mode until the output switches low.

For the RstComp comparator, i.e., the second comparator X0 of FIGS. 3, 5, 6, 8, and 9, operation is similar to that described above an is not explained further.

All references cited herein are hereby incorporated herein by reference in their entirety.

Having described preferred embodiments, which serve to illustrate various concepts, structures and techniques, which are the subject of this patent, it will now become apparent to those of ordinary skill in the art that other embodiments incorporating these concepts, structures and techniques may be used. Accordingly, it is submitted that the scope of the patent should not be limited to the described embodiments but rather should be limited only by the spirit and scope of the following claims.

What is claimed is:

1. An electronic circuit for driving an N-type transistor, the N-type transistor having a control node, an output node, and a power supply node coupled to a high voltage supply, the electronic circuit comprising:

a bootstrap voltage node capacitively coupled to the output node of the N-type transistor;

a first input transistor having a control node, a current input node, and a current output node, wherein the control node is coupled to receive a first input signal;

a second input transistor having a control node, a current input node, and a current output node, wherein the control node is coupled to receive a second input signal;

a first composite current mirror circuit having a control node, a current input node, and a current output node, wherein the control node of the first composite current mirror circuit is coupled to the current input node of the first input transistor, and wherein the current input node of the first composite current mirror circuit is coupled to the bootstrap voltage node;

a second composite current mirror circuit having a control node, a current input node, and a current output node, wherein the control node of the second composite current mirror circuit is coupled to the current input node of the second input transistor, and wherein the current input node of the second composite current mirror circuit is coupled to the bootstrap voltage node;

a first comparator having a first input node coupled to the current output node of the second composite current mirror circuit and having a second input node coupled to receive a first reference voltage, wherein the first reference voltage is related to a voltage at the output node of the N-type transistor, wherein the first comparator also has an output node; and a second comparator having a first input node coupled to the output node of the first composite current mirror circuit and having a second input node coupled to receive a second reference voltage, wherein the second reference voltage is related to the voltage at the output node of the N-type transistor, wherein the second comparator also has an output node.

2. The electronic circuit of claim 1, wherein the first composite current mirror circuit comprises:

a first current mirror having a control node, a current input node, and a current output node, wherein the control node of the first current mirror is coupled to the current input node of the first input transistor, and wherein the current input node of the first current mirror is coupled to the bootstrap voltage node;

a second current mirror having a control node, a current input node, and a current output node, wherein the control node of the second current mirror is coupled to the current output node of the first current mirror, and wherein the current output node of the second current mirror is coupled to the output node of the N-type transistor; and a third current mirror having a control node, a current input node, and a current output node, wherein the control node of the third current mirror is coupled to the current input node of the second current mirror, wherein the current input node of the third current mirror is coupled to the bootstrap voltage node, and wherein the current output node of the third current mirror is coupled to the first input node of the second comparator, and wherein the second composite current mirror circuit comprises:

a fourth current mirror having a control node, a current input node, and a current output node, wherein the control node of the fourth current mirror is coupled to the current input node of the second input transistor, and wherein the current input node of the fourth current mirror is coupled to the bootstrap voltage node, a fifth current mirror having a control node, a current input node, and a current output node, wherein the control node of the fifth current mirror is coupled to the current output node of the fourth current mirror, and wherein the current output node of the fifth current mirror is coupled to the output node of the N-type transistor; and a sixth current mirror having a control node, a current input node, and a current output node, wherein the control node of the sixth current mirror is coupled to the current input node of the fifth current mirror, wherein the current input node of the sixth current mirror is coupled to the bootstrap voltage node, and wherein the current output node of the sixth current mirror is coupled to the first input node of the first comparator.

3. The electronic circuit of claim 2, wherein the second current mirror further has a second current input node, wherein the second current input node of the second current mirror is coupled to the first input node of the first comparator, wherein the fifth current mirror further has a second current input node, and wherein the second current input node of the fifth current mirror is coupled to the first input node of the second comparator.

4. The electronic circuit of claim 3, wherein the N-type transistor is a first N-type transistor and is coupled to a second N-type transistor.

5. The electronic circuit of claim 3, wherein the first input signal is a reset input signal, and wherein the second input signal is a set input signal, wherein a voltage at the output node of the first comparator achieves a high state in response to a positive pulse in the set input signal, and wherein the voltage of the output node of the second comparator achieves a high state in response to a positive pulse in the reset input signal.

6. The electronic circuit of claim 5, further comprising:
a first current generator coupled between the output node of the N-Type transistor and the first input node of the first comparator; and
a second current generator coupled between the output node of the N-Type transistor and the first input node of the second comparator.

7. The electronic circuit of claim 6, further comprising:
a first voltage to voltage converter having first and second input nodes and first and second output nodes, wherein the first input node of the first voltage to voltage converter is coupled to the current output node of the second composite current mirror circuit, and wherein the second input node of the first voltage to voltage converter is coupled to receive the first reference voltage; and
a second voltage to voltage converter having first and second input nodes and first and second output nodes, wherein the first input node of the second voltage to voltage converter is coupled to the current output node of the first composite current mirror circuit, and wherein the second input node of the second voltage to voltage converter is coupled to receive the second reference voltage.

8. The electronic circuit of claim 7, further comprising:
a first low pass filter having an input node and an output node, wherein the output node of the first low pass filter is coupled to the first input node of the first comparator, wherein the input node of the first low pass filter is coupled to the first output node of the first voltage to voltage converter, and wherein the second input node of the first comparator is coupled to the second output node of the first voltage to voltage converter; and
a second low pass filter having an input node and an output node, wherein the output node of the second low pass filter is coupled to the first input node of the second comparator, wherein the input node of the second low pass filter is coupled to the first output node of the second voltage to voltage converter, and wherein the second input node of the second comparator, is coupled to the second output node of the second voltage to voltage converter.

9. The electronic circuit of claim 6, further comprising:
a first low pass filter having an input node and an output node, wherein the input node of the first low pass filter is coupled to the output node of the first comparator,
a second low pass filter having an input node and an output node, wherein the input node of the second low pass filter is coupled to the output node of the second comparator.

10. The electronic circuit of claim 9, wherein the second current mirror further has a third current input node and a fourth current input node, and wherein the fifth current mirror further has a third current input node coupled to the third current input node of the second current mirror and a fourth current input node coupled to the fourth current input node of the second current mirror.

11. The electronic circuit of claim 10, wherein the first comparator comprises:
a first comparator current mirror having a control node, a current input node, and a current output node, wherein the control node of the first comparator current mirror is coupled to receive a first speed signal from the third current input nodes of the second and fifth current mirrors that results in the first comparator achieving a higher output signal slew rate during a predetermined condition of the first speed signal; and wherein the second comparator comprises;
a second comparator current mirror having a control node, a current input node, and a current output node, wherein the control node of the second comparator current mirror is coupled to receive a first speed signal from the fourth current input node of the second and fifth current mirrors that results in the second comparator achieving a higher output signal slew rate during a predetermined condition of the second speed signal.

12. The electronic circuit of claim 3, wherein the first input signal is a set input signal, and wherein the second input signal is a reset input signal, wherein a voltage at the output node of the first comparator achieves a high state in response to a positive pulse in the set input signal, and wherein the voltage of the output node of the second comparator achieves a high state in response to a positive pulse in the reset input signal.

13. The electronic circuit of claim 12, further comprising:
a first current generator coupled between the bootstrap voltage node and the first input node of the first comparator; and
a second current generator coupled between the bootstrap voltage node and the first input node of the second comparator.

14. The electronic circuit of claim 13, further comprising:
a first voltage to voltage converter having first and second input nodes and first and second output nodes, wherein the first input node of the first voltage to voltage converter is coupled to the current output node of the second composite current mirror circuit, and wherein the second input node of the first voltage to voltage converter is coupled to receive the first reference voltage; and
a second voltage to voltage converter having first and second input nodes and first and second output nodes, wherein the first input node of the second voltage to voltage converter is coupled to the current output node of the first composite current mirror circuit, and wherein the second input node of the second voltage to voltage converter is coupled to receive the second reference voltage.

15. The electronic circuit of claim 14, further comprising:
a first low pass filter having an input node and an output node, wherein the output node of the first low pass filter is coupled to the first input node of the first comparator, wherein the input node of the first low pass filter is coupled to the first output node of the first voltage to voltage converter, and wherein the second input node of the first comparator is coupled to the second output node of the first voltage to voltage converter; and
a second low pass filter having an input node and an output node, wherein the output node of the second low pass filter is coupled to the first input node of the second comparator, wherein the input node of the second low pass filter is coupled to the first output node of the second voltage to voltage converter, and wherein the second input node of the second comparator, is coupled to the second output node of the second voltage to voltage converter.

16. The electronic circuit of claim 13, further comprising:
a first low pass filter having an input node and an output node, wherein the input node of the first low pass filter is coupled to the output node of the first comparator;
a second low pass filter having an input node and an output node, wherein the input node of the second low pass filter is coupled to the output node of the second comparator.

17. The electronic circuit of claim 16, wherein the second current mirror further has a third current input node and a fourth current input node, and wherein the fifth current mirror further has a third current input node coupled to the third current input node of the second current mirror and a fourth current input node coupled to the fourth current input node of the second current mirror.

18. The electronic circuit of claim 17, wherein the first comparator comprises:
a first comparator current mirror having a control node, a current input node, and a current output node, wherein the control node of the first comparator current mirror is coupled to receive a first speed signal from the third current input nodes of the second and fifth current mirrors that results in the first comparator achieving a higher output signal slew rate during a predetermined condition of the first speed signal; and wherein the second comparator comprises:
a second comparator current mirror having a control node, a current input node, and a current output node, wherein the control node of the second comparator current mirror is coupled to receive a first speed signal from the fourth current input node of the second and fifth current mirrors that results in the second comparator achieving a higher output signal slew rate during a predetermined condition of the second speed signal.

19. The electronic circuit of claim 1, wherein the first comparator comprises:
a first comparator current mirror having a control node, a current input node, and a current output node, wherein the control node of the first comparator current mirror is coupled to receive a first speed signal that results in the first comparator achieving a higher output signal slew rate during a predetermined condition of the speed signal; and wherein the second comparator comprises:
a second comparator current mirror having a control node, a current input node, and a current output node, wherein the control node of the second comparator current mirror is coupled to receive a second speed signal that results in the second comparator achieving a higher output signal slew rate during a predetermined condition of the second speed signal.

20. The electronic circuit of claim 1, wherein the first composite current mirror circuit comprises:
a first current mirror having a control node, a current input node, and first and second current output nodes, wherein the control node of the first current mirror is coupled to the current input node of the first input transistor, and wherein current input node of the first current mirror is coupled to the bootstrap voltage node; and
a second current mirror having a control node, a current input node, a current output node, wherein the control node of the second current mirror is coupled to the first current output node of the first current mirror, and wherein the current input node of the second current mirror is coupled to the first input node of the first comparator, and wherein the second composite current mirror circuit comprises:
a third current mirror having a control node, a current input node, and first and second current output nodes current output node, wherein the control node of the third current mirror is coupled to the current input node of the second input transistor, and wherein the current input node of the fourth current mirror is coupled to the bootstrap voltage node; and
a fourth current mirror having a control node, a current input node, and a current output node, wherein the control node of the fourth current mirror is coupled to the first current output node of the third current mirror, and wherein the current input node of the fourth current mirror is coupled to the first input node of the second comparator, wherein
the second current output node of the first current mirror is coupled to the current input node of the fourth current mirror, and wherein
the second current output node of the third current mirror is coupled to the current input node of the second current mirror.

* * * * *